SOLID-STATE DEVICE WITH DIFFERENTIALLY EXPANDED JUNCTION SURFACE

Filed Sept. 28, 1965

Inventor
Chou H. Li

United States Patent Office 3,430,109

Patented Feb. 25, 1969

3,430,109

SOLID-STATE DEVICE WITH DIFFERENTIALLY EXPANDED JUNCTION SURFACE

Chou H. Li, 379 Elm Drive, Roslyn, N.Y. 11576

Filed Sept. 28, 1965, Ser. No. 490,955

U.S. Cl. 317—234 20 Claims

Int. Cl. H01l 5/02, 3/00

ABSTRACT OF THE DISCLOSURE

The novel solid-state devices disclosed herein are made with special attention to the configuration of the exposed junction or active region surface whereby this surface is differentially expanded into a prescribed geometrical shape, such as a cylindrically concave surface into a prescribed geometrical shape, another surface of revolution or, in general, a surface of oriented arcuate cross-section.

The invention is useful not only in diodes or transistors, but also in many other types of existing or new solid-state devices, which will be optimized thereby in respect to breakdown voltage, leakage current, efficiency in signal translation, stability in contaminating ambients, and other performance characteristics.

Solid-state devices in general and semiconductor devices in particular must have exacting surface properties for successful operations. These devices therefore often fail by surface failure mechanisms. Such failures include many types of instability, noise, low breakdown voltage, and high leakage current. The surface of a pn, $p^+n$, $pn^+$, $p^+p$, $n^+n$, pi, or ni junction, other interfacial rectifying barrier region, or other optoelectromagnetically active region including several coacting, closely spaced rectifying junctions or rectifying barriers, is especially sensitive to the ambient, contaminants, or impurities. While not limited thereto, the invention is herein described as applied to a semiconductor device having a pn junction as its optoelectromagnetically active region.

An important object of the invention is to achieve controlled and stabilized device performances.

A further object of the invention is to reduce the harmful electrical fields on the junction surface.

Yet another object of the invention is to obtain semiconductor devices having junction surfaces that are relatively inert to the ambient, contaminants, or impurities.

Another object of the invention is to achieve on an active region an exposed surface having a prescribed geometry for the protection of said surface against contamination or against the formation of shorting path thereon by its rubbing contact with external solid surfaces.

A still further object of the invention is to produce controlled optoelectromagnetic (i.e., optical, electrical, magnetic, electro-optical, electromagnetic, and the like) device responses to the ambient, contaminants, or impurities at or near the junction surface.

Further objects and advantages of my invention will appear as the specification proceeds.

The preferred form of my invention is illustrated in the accompanying drawing, in which.

Figures 1, 2, 3, 4, 5:
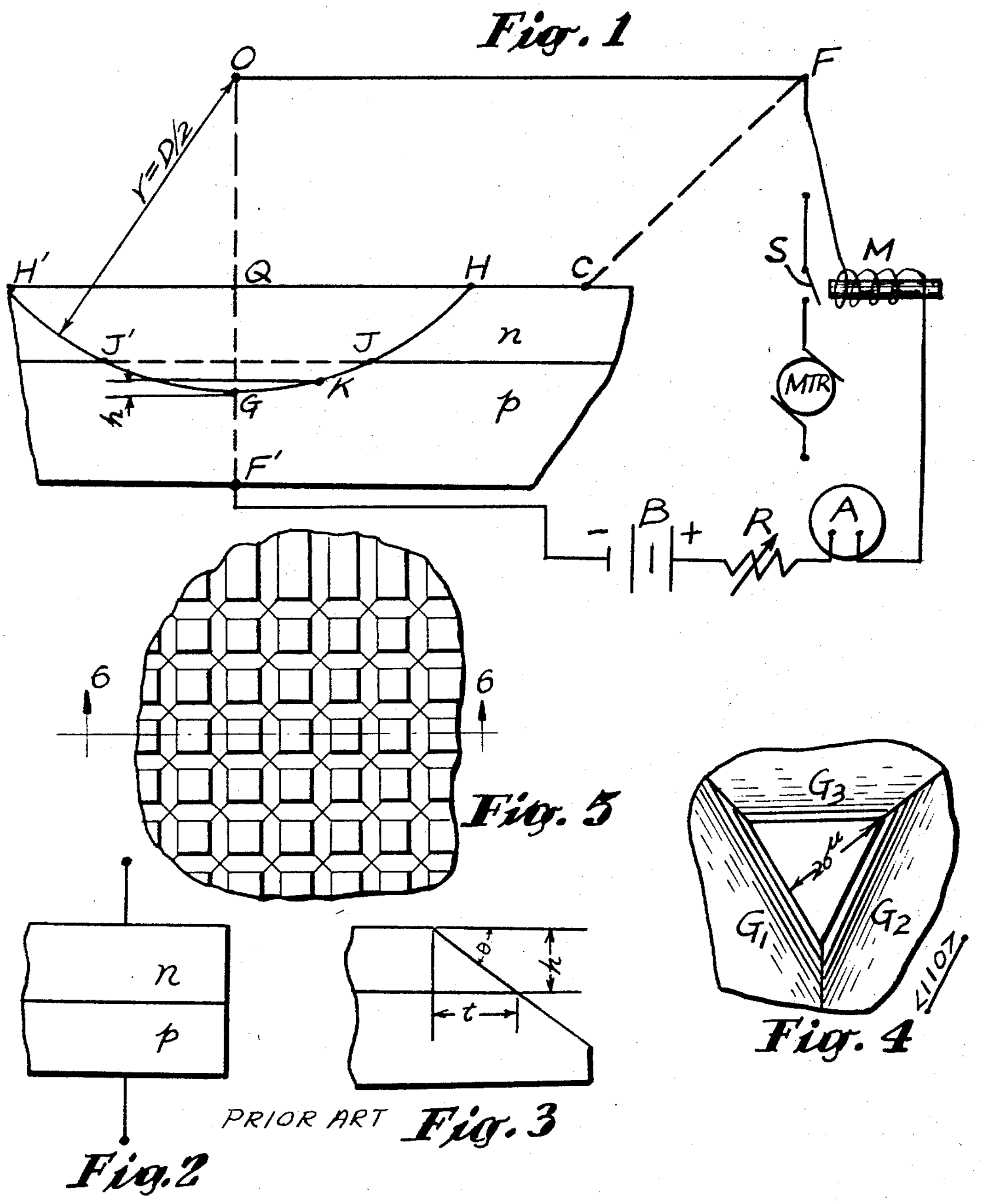
FIG. 1 is a schematic diagram showing one setup to manufacture the herein disclosed semiconductor devices.
FIG. 2 is a cross-section of a mesa device introduced here for comparison with the present invention.
FIG. 3 is a cross-section of a beveled semiconductor device also used for comparison.
FIG. 4 is a plan view of one version of my new device.
FIG. 5 is a top view of a microcircuit piece containing a system of normally intersecting grooves.

With reference to FIG. 1, my new device may be made by the preparation of a pn junction in a semiconductor wafer material, and grinding or polishing the wafer surface until the junction region is reached and/or passed. A practical grinding tool may be a rotating cylinder, sphere, cone, or specially contoured tool. Such a tool may have tiny, sharp teeth, or controlled roughness, on its grinding surface; or may have abrasive particles cemented or brazed onto the same surface. A simpler scheme is, however, to employ a smooth-surfaced tool provided with fine abrasive particles carried in a fluid medium. Spherical or contoured rotating tools are particularly useful to locally stabilize the surface property, or to isolate minute junction regions at specific locations.

Although the rotating tool in FIG. 1 may be a cylinder, sphere, or other tool with smooth or controlled surface roughness, the following description will be made using a rotating smooth cylinder as an example. The grinding or polishing operation is to be referred to as a "grooving" operation; and the resultant depression, or cylindrically concave surface, as a "groove."

The depth of the groove depends on the desired junction properties and the operating conditions of the device. In general, the newly exposed or grooved surface should more than extend across the entire depletion region, even when the device is under its maximum operating reverse bias. Such a groove would then electrically isolate the junction and locally define the active area of the junction. In a like manner, several semiconductor devices can be electrically isolated from one another, or from other active or passive circuit components, by means of a number of intersecting grooves, even on the same device wafer having a single junction plane to start with. To maximize the desired results or produce special effects, the direction of grooving may be made to coincide with a crystallographic direction of extreme atomic density, e.g., a <110> direction on (111) wafers of silicon or germanium.

The control of the grooving depth can be achieved either manually, or mechanically, or by other means. FIG. 1 shows an electrical control method in which a reverse bias is applied across the pn junction to effect the desired control. This reverse bias may be applied by means of a conductive grooving tool, as shown in FIG. 1 by the circuit BRAMSFOQGF'B. Alternately, as shown by the dotted line in the same figure, part of the biasing circuit may be through a fluid conducting medium (such as an electrolyte used to carry the abrasive particles) between the grooving tool and the grooved surface of the junction, i.e., along the path CHJKG. The electrical path in this case is:

BRAMSFCHJGF'B

When the junction region is ground through, the junction becomes shorted out, the electrical resistance of the above circuit drops appreciably. The reverse current then increases markedly and, by design, sufficiently to actuate the electromagnet M and switch S thereby, through switch S and other easily designed means, stopping the grooving operation automatically. The grooving operation can thus be accurately controlled. Further, the groove depth on a variety of different semiconductor devices can be exactly reproduced merely by selecting a suitable reverse bias, together with a proper design of the electromagnet M, switch S, and the other accessory components. A reverse bias greater than the maximum device operating voltage should generally be applied during the grooving operation to guarantee complete electrical isolation of the active region. The result of grooving is a cylindrical groove, such as the one shown in FIG. 1 as HJGJ'H'.

FIG. 1 also shows that the groove not only cuts through the upper (n-type) semiconducting material, but also exposes a relatively flat area (at G) in the lower (p-type) semiconducting material. Such an area provides a very convenient spot for making an electrical contact to the otherwise unexposed lower semiconducting material.

It can be seen, particularly in comparison with a mesa junction surface shown in FIG. 2, that the junction surface exposed by the groove is greatly expanded. At certain critical locations, this surface may be expanded 71 or more times, as will be shown. This greatly expanded area at the critical junction region markedly reduces the harmful electrical fields on the junction surface and enhances the interaction of said surface with the ambient, such as for efficiently surface-cooling a device operating under high-power conditions or under the application of unusually large energies into the junction region. Further, the expanded junction surface of a prescribed shape significantly facilitates carrier injections by light or other means to, for example, translate an optical or radiation signal into an electrical or electromagnetic signal, or to transform a radiant energy on said surface into a useful electrical energy at the end or terminal surfaces of the junction or active region of the device. The combination of differential expansion and prescribed geometry of the expanded surface provides the opportunity to specifically design even each minute junction surface area or volume region according to local requirements, thereby achieving additional benefits, not hitherto possible, in optimizing the overall device performance (in respect to efficiency, stability, size, weight, . . .). New devices sensitively responsive to the chemical, physical, optoelectromagnetical, or other conditions of the ambient can now be acquired. Other devices may also be made to obtain prescribed, differential interactions of the junction surface with different positions in its surrounding ambient. In addition, novel controls of carrier generations, movements, and recombinations hitherto considered impossible are now allowed inside or near the junction or active region of the device.

The junction may also be exposed and uniformly expanded by beveling, that is, polishing to a bevel angle $\theta$ (FIG. 3). This method is a recent innovation and promises to become a commercial success. Such a method is, however, not as versatile and practical in many cases as the method according to this invention. In the beveling method, the degree of surface expansion depends only on the bevel angle $\theta$, i.e. $E_b=(h^2+t^2)^{1/2}/h=\csc\theta$. Yet this bevel angle cannot be very small, or the beveled surface would extend too much laterally and device miniaturization is hampered. It is also inconvenient or impractical to obtain more than one beveled surface in a small region, or to completely isolate an active region by multiple bevelings. Beveling also requires highly skilled labor exerting exact, time-consuming controls to achieve any reasonable degree of reproducibility.

On the other hand, grooving can be done easily, quickly, accurately, automatically, and inexpensively. The degree of surface expansion in grooving depends on the diameter D of the grooving cylinder and the maximum depth $h$ of the grooved surface below the position K under consideration. These parameters D and $h$ can be changed at will to meet special demands. The groove also differentially expands, on the same device wafer or even junction, the junction surface on a microscopic scale, and can therefore be predesigned according to local surface requirements.

Grooving also easily achieves more surface expansion than beveling. As seen in FIG. 1, this expansion, being related to the slope of the tangent at K to the grooved surface GKJH, is $E_g=r/(2rh-h^2)^{1/2}\simeq\csc\theta_e$, where $\theta_e$ is the equivalent bevel angle. For very small $h$ (compared to $r$), as is usually the case, $E_g=0.707(r/h)^{1/2}$. Thus with a 2 cm. grooving cylinder ($r=1$) and an $h=1$ micron$=10^{-4}$, the local surface expansion is $E_g=70.7$, and the equivalent bevel angle $\theta_e$ is less than 49 minutes. Such a small bevel angle is very hard to be reproduced on a practical, mass-production basis at any cost.

Advantages may be taken of the differential surface expansion effect of the cylindrical groove to design surface-stabilized semiconductor devices. The heavily doped semiconductor material near the junction, for example, may be greatly expanded locally to achieve maximum surface stabilization, or to obtain enhanced injection or other properties. The less doped material, on the other hand, is usually less sensitive to surface conditions or ambients; the degree of surface expansion here can therefore be small to conserve space. The grooving method is especially suited for critical applications because with very small values of $h$, the local surface expansion $E_g$ can even approach infinity.

It can be shown that maximum junction surface expansion with a cylindrical groove is obtained when the bottom terminal surface of the junction region is tangent to the groove. For a junction region 1 $\mu$m. (or $10^{-4}$ cm.) thick and groove radius $r=1$ cm., the surace expansion at the lowest point or point of tangency (where $h=0$) approaches infinity, while the same expansion at the intersection of the top terminal surface of the junction region and the groove is 70.7, as indicated above. The total surface expansion for the entire 1 $\mu$m. junction region is, by integration, 141.4. That is, the exposed surface is now 141.4 $\mu$m. wide instead of the original 1$\mu$m. This figure of total expansion is given in the accompanying table, together with other such figures for different combinations of $r$ and $h_m$. In this table, $h_m$ refers to the value of $h$ at the lowest point (i.e., G in FIG. 1) on the cylindrical groove. A negative or positive $h_m$ indicates that G is respectively above or below the lower end or terminal surface of the junction region. It can be seen from the table that for a given $h_m$, the surface expansion increases by about threefold for every tenfold increase in $r$. Further, for most combinations of $r$ and $h_m$, the surface expansion greatly exceeds 5.76, which requires a taper angle $\theta$ of less than 10°. Such a small taper angles is very hard to be reproduceably made, even on only one side of a simple device. In addition, the table shows that the surface expansion is sensitively related to $h_m$, or the depth of the groove. Greatly expanded surfaces cannot, therefore, be obtained unless the grooving operator is clearly and specifically taught to carefully and exactly position the groove in the junction region. The surface expansion for grooves having shapes other than cylinders can be similarly computed.

Surface expansion for different $r$ and $h_m$, for junction thickness$=1$ $\mu$m.

| $h_m/r$ | $10^2$ | 10 | 1 | $10^{-1}$ | $10^{-2}$ | $10^{-3}$ | $10^{-4}$ cm. |
|---|---|---|---|---|---|---|---|
| −0.9 $\mu$m. | 448.5 | 141.6 | 44.72 | 14.14 | 4.473 | 1.415 | 0.4510 |
| −0.5 | 1,001 | 316.3 | 100.0 | 31.62 | 10.00 | 3.176 | 1.047 |
| −0.1 | 1,343 | 424.3 | 134.2 | 42.43 | 13.43 | 4.275 | 1.471 |
| 0.0 | 1,414 | 447.2 | 141.4 | 44.73 | 14.15 | 4.510 | 1.571 |
| 0.1 | 1,035 | 327.6 | 103.6 | 32.77 | 10.37 | 3.319 | 1.220 |
| 1.0 | 585.9 | 185.2 | 58.58 | 18.53 | 5.880 | 1.925 | ---------- |
| 5.0 | 301.9 | 95.45 | 30.19 | 9.558 | 3.061 | 1.121 | ---------- |
| 20.0 | 156.2 | 49.39 | 15.63 | 4.965 | 1.649 | ---------- | ---------- |

It can thus be seen that while tapering may moderately expand the junction region surface (typically up to 2.8 or 5.7×), grooving usually greatly expands the same surface (generally 50 to 500×) and, in particular, may selectively expand infinitely certain critical points or lines on the device. An expanded junction surface is well-known to reduce junction contamination by reducing the surface field gradient and hence the oriented accumulation of mobile ions and floating particles, to be called type I contaminants hereinafter.

Grooving, or other surface-contouring, accomplishes an added desirable result, i.e., the elimination of residual shunting streaks of type II contaminants upon rubbing contact of the junction region, with relatively moving external solid surfaces. The effect of type II contaminants is not well-recognized but is ever-present and often extremely serious. These contaminants may be in the form of greases, oxides, dust films, and metallic or non-metallic layers on the surface of jigs, dies, tools, tweezer tips, operators' fingers, or on the inside wall of beakers or other containers. They may also come from relatively moving dust particles, metal platings or coatings, or even a higher-conductivity semiconducting material on a neighboring device. Although type II contaminants are made less dangerous if the device is surface-passivated by a layer of oxide, nitride, glass, organics, and the like, they are still troublesome during the device manufacture before, or even during, such passivation steps.

The residual streaks of contaminants may inductively or capacitively couple with, or simply short out, the junction region. As an example, a single rubbing contact of the junction with the gold-plated film of a neighboring device may introduce a shorting streak consisting of only an atomic chain. This chain, for a 1-$\mu$m. junction region, is computed to contain some 3,903 gold atoms weighing only $1.28\times10^{-18}$ grams and have a resistance of some 0.334 megohm, thereby giving a leakage current of 0.15 ma. at a reverse voltage of 50 volts. Such a high leakage current often makes the device totally unfit for its intended use.

A contacting flat surface may easily contaminate badly a tapered junction region surface, particularly if there is a relative motion between the junction and flat surface to enhance abrasion and material transfer. A moving dust particle may also contaminate the same junction surface. A cylindrically or otherwise curvedly grooved junction can only be contaminated by dust particles having exactly matching geometries, i.e., concave vs. convex surfaces with identically the same radii at the contact region and moving in exactly the same direction as the groove. This is practically impossible. A nonyielding, flat surface can therefore never contaminate such a grooved junction by rubbing contact. Contamination of even a junction with *two* linear tapers thereon is very unlikely, even by a single particle because the rubbing particle must then suddenly change direction of movement at the right time and by the precise amount. This is again impossible because the particle has finite radius, size, mass, and momentum. Elastic or plastic deformation of the rubbing surfaces only slightly increases the chance of contamination by type II contaminants.

The effect of type I and type II contaminants may locally complement or reinforce each other. For example, an incomplete shunting streak of type II contaminants may locally build up an intense field to attract type I contaminants to fill in the gap. An incomplete streak of type I contaminants may also produce a concentrated field strong enough to modify the trajectory of a nearby moving particle thereby increasing the chance of complete shunting.

Other unique and beneficial effects of grooving or surface-contouring have already been previously indicated. Dependent on the device design, use, and manufacturing procedures, one may put more emphasis on reducing type I or II contaminants, or on achieving special effects; and thus select the best surface contour and optimum combination of $r$ and $h_m$. For maximum surface expansion, one should use as large an $r$ and make $h_m$ as close to zero as possible, giving maximum protection against type I but much less protection against type II contaminants. On the other hand, if type II contamination problem is very serious, or if hundreds of closely-spaced circuit elements must be isolated from one another on a single 2-cm. wafer in microcircuitry work, $r$ must necessarily be small, thereby providing less protection against type I contaminants.

A further advantage of the grooving method is that the grooving cylinder can be controllably tilted relative to the device wafer surface during the grooving operation. This tilting action adds an additional dimension to the control of surface expansion. The junction can now be differentially expanded not only in the transverse direction, but also in the longitudinal direction. Additional beneficial features, or even new devices, can thereby be easily and inexpensively attained or made.

The grooved region generally suffers some mechanical damages. These damages may or may not be very serious.

Severely damaged materials can easily be removed by suitable chemical etches.

FIG. 4 shows a small semiconductor device whose active junction area is defined by three intersecting cylindrical grooves: $G_1$, $G_2$, and $G_3$. As shown, these grooves are in the <110> directions on (111) silicon or germanium device wafers. These directions represent crystallographic directions of extreme atomic packing densities. Unwanted, microscopic cracks that are difficult to detect yet may significantly affect device performances are less likely to occur if grooving is done along these directions.

Figure 6:
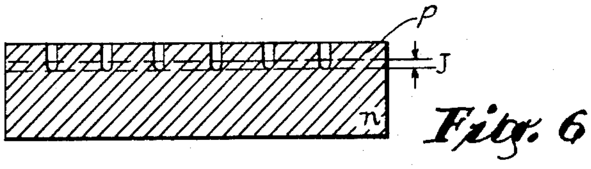
FIG. 6 is a cross-section of the device of FIG. 5, taken along the line 6—6.

FIG. 5 shows a top view of a piece of a monolithic micro-circuitry broken off from a 2 cm. x 2 cm. semiconducting wafer containing, say 30 x 30 or 900 individual, isolated or discrete units of circuit elements. Notice that there are two groups of linear and mutually perpendicular grooves. FIG. 6 shows a vertical cross-section of the same microcircuitry piece taken along line 6—6 of FIG. 5. The cross-section shows that the grooves are partly cylindrical and that the bottom lines of the grooves just touch the lower end or terminal surface of the junction thereby achieving maximum surface expansion. Each of the isolated or discrete circuit elements may be made to operate independently of one another in a specified signal translation operation therein with a performance improved by the differentially expanded junction surface thereon provided by the grooving system.

The invention is not to be construed as limited to the particular forms disclosed herein, since these are to be regarded as illustrative rather than restrictive.

What is claimed is:

1. A surface-stabilized semiconductor device comprising a p-type semiconducting material, an n-type semiconducting material, and a pn junction region between and electronically connected to said two materials, a portion of said junction region having thereacross a substantially cylindrically differentially expanded concave surface.

2. A solid-state device comprising a first solid-state material, a second solid-state material substantially differing from said first material in at least one of the optoelectromagnetic properties including electronic carrier conductivity, electronic carrier mobility, electronic carrier lifetime, photoelectric property, and thermoelectric property, a pn junction region between said two materials, a portion of said junction region having thereacross a differentially expanded surface cutting through said first solid-state material while exposing a small area on said second solid-state material underneath said junction region, and an electrical contact terminating in the exposed area of said second solid-state material.

3. In a signal-translating solid-state device of the type having an interfacial rectifying barrier region contained therein for the translation of optoelectromagnetic signals at least partly through body effects, the performance of said barrier region in the signal translation being enhanced with improved geometry and increased total surface area across said barrier region, a portion of said region having thereacross an elongated contoured surface having a longitudinal axis and a transverse arcuate cross-section, said axis being nonparallel to a line locally normal to said region whereby said surface is substantially differentially expanded into a prescribed geometrical shape across said region as a result of which the performance of said device in said signal translation is substantially improved.

4. The device of claim 3 wherein said axis substantially coincides with a crystallographic direction of extreme density of atomic packing.

5. A signal-translating device active region comprising semiconducting material zones arranged in succession, contiguous zones being of opposite conductivity type thereby forming a plurality of rectifying pn junction layers, a portion of said active region having a differentially expanded contour surface across said layers.

6. A semiconductor device comprising a first semiconducting material of one conductivity type and having one net impurity doping level, a second semiconducting material of the opposite conductivity type and having a higher net impurity doping level, and a relatively planar pn junction region between and electronically connected to said two materials, a portion of said junction region containing a substantially differentially expanded cylindrical surface having its axis generally parallel to said region locally and located nearer to said first material than to said second material thereby expanding the exposed surface to a substantially greater degree in the more heavily doped second material than in the less doped first material.

7. A solid-state device interfacial rectifying barrier region having substantial resistance to surface contamination by mobile ions, floating particles, and rubbing contacts which external solid surfaces, comprising a substantially differentially expanded exposed surface across a portion of said barrier region, said differentially expanded surface being in the form of an oriented surface of revolution unmatchable by said external solid surfaces in the regions of said contacts.

8. In a solid-state device of the type having an interfacial rectifying barrier region therein adapted to translate optoelectromagnetic signals of a prescribed kind, in which the width of said region increases with any reverse bias applied thereacross but decreases with any forward bias applied thereacross, and during the manufacture of which the ambient-surrounded or exposed surface of said region is contaminable by its contact with an external, relatively moving substantially linearly, contaminating surface, an exposed surface across a portion of said region and containing on a plane locally normal to said region an arcuate cross-section thereby substantially differentially expanding said exposed surface into a prescribed shape and simultaneously reducing the possibility of forming a continuous contaminated path across said region during a single contact with said contaminating surface.

9. A solid-state device comprising a first solid-state material having a fixed Fermi level, a second solid-state material having a second or different fixed Fermi level, said two materials having contiguous surface portions thereby forming therebetween an interfacial barrier region over which the electronic energy level changes from one of said Fermi levels to the other and which electrical currents are carried by both drifting and diffusing mobile carriers, an active region including said barrier region but extending one carrier diffusion length outwardly on either side thereof and adapted to translate an input optoelectromagnetic signal to a different output signal, said region being contaminable by mobile ions, floating particles and rubbing contact resulting in its performance in the signal translation being dependent on the area and geometry of its surface across said active region, and a curved surface across a portion of said active region and having on a plane locally normal to said region an arcuate cross-section oriented to substantially differentially expand said surface into a prescribed geometrical shape.

10. A monolithic integrated circuitry comprising a semiconductor wafer having contained therein a pn junction region adapted to translate optoelectromagnetic signals of a specific kind, the performance of said region in the signal translation being related to the area and geometry of the surface across said region, and a system of linear intersecting grooves originating from one wafer surface but penetrating at least partly into said region, each of said grooves having an arcuate transverse cross-section in said region whereby at least a portion of the surface across said region is substantially differentially expanded into large areas of prescribed geometries and simultaneously discrete units of electronic components are substantially isolated electronically one from the other.

11. A monolithic integrated solid-state circuitry comprising a first body of a first solid-state material, a second body of a second solid-state material thereon, said two bodies having contiguous surface portions thereby forming therebetween an interfacial rectifying barrier region adapted to translate optoelectromagnetic signals of a specific kind, the performance of said region in the signal translation being related to the area and geometry of the pheripheral surface of said region, and a system of closed-end grooves originating in said first body while penetrating at least partly into said region and having at least partly an arcuate transverse cross-section in said region whereby said surface is substantially differentially expanded into large areas of prescribed geometries and simultaneously discrete units of solid-state components are substantially isolated one from the other.

12. In a solid-state device of the type having an interfacial rectifying barrier region therein adapted to capture mobile electrical current carriers injected by an external energy source onto said device, the efficiency of capture of the injected carriers being related to the area and geometry of the surface across said region, a substantially differentially expanded surface across a portion of said region and having on a plane locally normal to said region a cross-section containing a substantially non-infinite radius of curvature.

13. A radiation-sensitive solid-state device comprising a first continuous solid-state substrate layer, an outer solid-state layer thereon, said layers having contiguous surface portions thereby forming therebetween an interfacial rectifying barrier region, the materials of said outer layer and said barrier region being adapted to generate radiation-induced minority carriers for capture by said barrier region so as to produce a useful electrical current if said carriers are generated in an active region including said barrier region but extending to one carrier diffusion length into said outer layer, and a depression originating in and penetrating said outer layer but extending at least partly into said active region and having on a plane locally normal to said region a curved cross-section to substantially differentially expand the radiation-exposed surface of said active region thereby significantly increasing the absorption of said radiation particles and the generation of said minority carriers and of said electrical current.

14. A surface-expanded energy-transformng solid-state device comprising a properly biased interfacial rectifying barrier region adapted to transform an input energy into an output energy of different form, one of said energies being in the form of electricity at the two ends or terminal surfaces of said region and the other energy being in the from of radiation at the peripheral surface of said region, the performance of said region in the energy transformation being related to the area and geometry of said peripheral surface of said region, and a depression having on a plane locally normal to said region an arcuate cross-section located at least partly in said region whereby a substantially differentially expanded peripheral surface of a prescribed geometry and increased total area is exposed in said region to enhance the performance of said energy transformation.

15. A solid-state device comprising a relatively planar interfacial rectifying barrier region adapted to translate optoelectromagnetic signals of a prescribed kind, and an elongated depression having at least on a portion thereof a surface representable by a surface of revolution and located at least partly in but tilted to said region thereby differentially expanding the peripheral surface of said region in directions both normal and parallel to said region.

16. A solid-state device comprising an interfacial rectifying barrier region having at each of a plurality of positions therein a curved peripheral surface portion, the cross-section of said surface portion in a plane locally normal to said region at each of said positions being at least partly representable by a mathematical equation of an order higher than one, said mathematical equation when expresed with common reference to said barrier region varying from one of said positions to the other thereby differently differentially expanding said surface portions.

17. A radiation particle impact position sensitive solid-state device comprising an interfacial rectifying barrier region adapted to capture radiation-induced minority carriers for recombination into useful electrical currents and having at each of a plurality of positions therein a curved radiation-exposed peripheral surface portion, the cross-section of said surface portion in a plane locally normal to said region at each of said positions being at least partly representable by a mathematical equation of an order higher than one, said mathematical equation when expressed with common reference to said barrier region varying from one of said positions to the other thereby differently differentially expanding said surface portions as a result of which a uniform flux of specified radiation particles falling on said different positions causes different amounts of minority carrier generations and recombinations to give different electrical currents of captured minority carriers.

18. A surface-expanded solid-state device comprising a first solid-state material body, a second solid-state material body thereon, one of said bodies containing an excess while the other a deficiency of mobile electrons during the operation of said device, a relatively thin but fairly uniform intermediate solid-state material layer between and in electronically operative association with said two bodies for the translation of electromagnetic signals therein, said layer having a peripheral surface contaminable by mobile ions, floating particles, and rubbing contact with an external solid body and characterized by an electrical resistivity substantially higher than those of said two bodies during said operation, and a depression having across a portion of and in a plane locally normal to said layer a curved cross-section located at least partly in said layer and representable by a mathematical equation of an order higher than one whereby the surface of said layer is substantially differentially expanded.

19. The device of claim 18 wherein said cross-section is circular and said depression is elongated with its longitudinal axis oriented generally parallel to said layer and the rate of surface expansion at at least one point on said cross-section exceeds 50 times.

20. A solid-state device comprising a first solid-state material, a second solid-state material having an optoelectromagnetic property different from that of said first material, an interfacial rectifying barrier region between said two materials and contaminable by mobile ions, floating particles, and rubbing contact, a portion of said region having thereacross a concave surface containing on a plane locally non-parallel to said region an arcuate cross-section thereby substantially differentially expanding said region and cutting into said first solid-state material while simultaneously optoelectromagnetically uncovering an area on said second solid-state material underneath said region, and means for optoelectromagnetic communication with the thus uncovered area on said second solid-state material.

References Cited

UNITED STATES PATENTS

| | | | |
|---|---|---|---|
| 3,076,104 | 1/1963 | Miller | 307—88.5 |
| 3,081,418 | 3/1963 | Manintveld et al. | 317—128 |
| 3,098,160 | 7/1963 | Noyce | 307—88.5 |
| 3,200,311 | 8/1965 | Thomas et al. | 317—234 |
| 3,233,305 | 2/1966 | Dill | 29—25.3 |
| 3,247,428 | 4/1966 | Perri et al. | 317—234 |
| 3,260,634 | 7/1966 | Clark | 156—17 |
| 3,278,347 | 10/1966 | Topas | 148—33.2 |
| 3,278,814 | 10/1966 | Rutz | 317—235 |
| 3,290,539 | 12/1966 | Lamorte | 313—114 |
| 3,320,496 | 5/1967 | Topas | 317—234 |

OTHER REFERENCES

IBM Technical Disclosure Bulletin, Michelitsch, "Light-Emitting, Gallium Arsenide Diode," vol. 8, No. 1, June 1965, p. 191.

JOHN W. HUCKERT, *Primary Examiner.*

R. SANLERS, *Assistant Examiner.*

UNITED STATES PATENT OFFICE
CERTIFICATE OF CORRECTION

Patent No. 3,430,109 February 25, 1969

Chou H. Li

It is certified that error appears in the above identified patent and that said Letters Patent are hereby corrected as shown below:

Column 2, line 50, "BRAMSFCHJGF'B" should read -- BRAMFCHJGF'B --. Column 7, line 17, "which" should read -- with --; line 45, "and which" should read -- and within which --. Column 8, line 47, "ends" should read -- end --.

Signed and sealed this 7th day of April 1970.

(SEAL)
Attest:

Edward M. Fletcher, Jr.
Attesting Officer

WILLIAM E. SCHUYLER, JR.
Commissioner of Patents